United States Patent [19]

Blaauw et al.

[11] Patent Number: 5,689,432

[45] Date of Patent: Nov. 18, 1997

[54] INTEGRATED CIRCUIT DESIGN AND MANUFACTURING METHOD AND AN APPARATUS FOR DESIGNING AN INTEGRATED CIRCUIT IN ACCORDANCE WITH THE METHOD

[75] Inventors: David T. Blaauw; Robert L. Maziasz; Joseph W. Norton; Larry G. Jones; Mohankumar Guruswamy, all of Austin, Tex.

[73] Assignee: Motorola, Inc., Schaumburg, Ill.

[21] Appl. No.: 373,695

[22] Filed: Jan. 17, 1995

[51] Int. Cl.[6] ............................................. G06F 17/50
[52] U.S. Cl. ...................... 364/490; 364/488; 364/489; 364/491
[58] Field of Search ............................... 364/488, 489, 364/490, 491

[56] References Cited

U.S. PATENT DOCUMENTS

| | | | |
|---|---|---|---|
| 4,827,427 | 5/1989 | Dunlop et al. | 364/491 |
| 5,031,111 | 7/1991 | Chao et al. | 364/491 |
| 5,222,030 | 6/1993 | Dangelo et al. | 364/489 |
| 5,299,137 | 3/1994 | Kingsley | 364/489 |
| 5,349,542 | 9/1994 | Brasen et al. | 364/488 |
| 5,351,197 | 9/1994 | Upton et al. | 364/490 |
| 5,369,596 | 11/1994 | Tokumaru | 364/490 |
| 5,455,775 | 10/1995 | Huber et al. | 364/490 |
| 5,502,649 | 3/1996 | Hirata | 364/490 |
| 5,510,999 | 4/1996 | Lee et al. | 364/491 |
| 5,537,580 | 7/1996 | Giomi et al. | 364/490 |

OTHER PUBLICATIONS

Motorola H4CPlus Series Design Ref. Guide, Rev. 2 1995.
"Experiments Using Automatic Physical Design Techniques for Optimizing Circuit Performance," Dunlop et al; 1990 IEEE, pp. 216–220.
"Computing the Entire Active Area Versus Delay Trade-Off Curve for Gate Sizing with a Piecewise Linear Simulator," Buurman et al.
"Optimization–Based Transistor Sizing," Shyu et al; IEEE 1987 Custom Integrated Circuits Conference, pp. 417–420.

Primary Examiner—Kevin J. Teska
Assistant Examiner—Tyrone V. Walker
Attorney, Agent, or Firm—Keith E. Witek

[57] ABSTRACT

A method for designing an integrated circuit involves a four step process. First, a behavioral circuit model (BCM) is read which contains assignment statements which identify the logical operation of an integrated circuit (IC). The BCM is translated to a data file which described a plurality of interconnected logic gate functions to duplicate the operation of the BCM. The gates in the data file are then assigned a specific Vdd and ground rail size, a specific drive strength for speed considerations, and a cell pitch or height to optimize physical layout, in any order. The result in a physical design file which may be used to form masks and integrated circuits having optimized speed and optimized circuit area in a short design cycle.

21 Claims, 3 Drawing Sheets

INTEGRATED CIRCUIT DESIGN AND MANUFACTURING METHOD AND AN APPARATUS FOR DESIGNING AN INTEGRATED CIRCUIT IN ACCORDANCE WITH THE METHOD

FIELD OF THE INVENTION

The present invention relates generally to data processing systems, and more particularly, to designing an integrated circuit via a data processing system.

BACKGROUND OF THE INVENTION

The use of library defined cells to design an integrated circuit is known in the art. These known libraries allow for semi-custom design which is advantageous to the IC industry. Currently, a library contains cells that vary in two aspects: drive strength and logic function. Therefore, a designer can design an IC using logic cells which are optimized only for drive strength (i.e., speed). There is no way, other than a manual task of redesign which is slow, expensive, and subject to human error, to optimize Vdd and ground power rail sizing and/or the physical size (pitch {also referred to as height} and width) of a two-dimensional layout of a cell for optimal silicon surface area. In many cases when redesigning a part for another customer or application or when developing the next IC in a family of processors, the limitation of only having a degree of freedom in drive strength from a library is significantly limiting and result is significant user re-design at the end of the CAD (computer aided design) cycle.

Current CAD approaches perform design of an IC in typically a two step process. First, the logic function of the needed cells is determined, and second the drive strength of each cell is determined. A great limitation of the current approach is that the variation of the cells in the library is limited to only two aspects. A number of physical aspects of the library cells, (such as cell height and cell power rail size) are therefore determined before the library is designed and are fixed for all cells in the library and therefore overcompensate some modules of the IC at the expense of substrate area and undercompensate other modules resulting in redesign. This "one-size-fits-all" approach to some physical aspects of a cell in an IC limits the effectiveness of the current approach, substrate area minimizing, and time to market.

Figure 1:
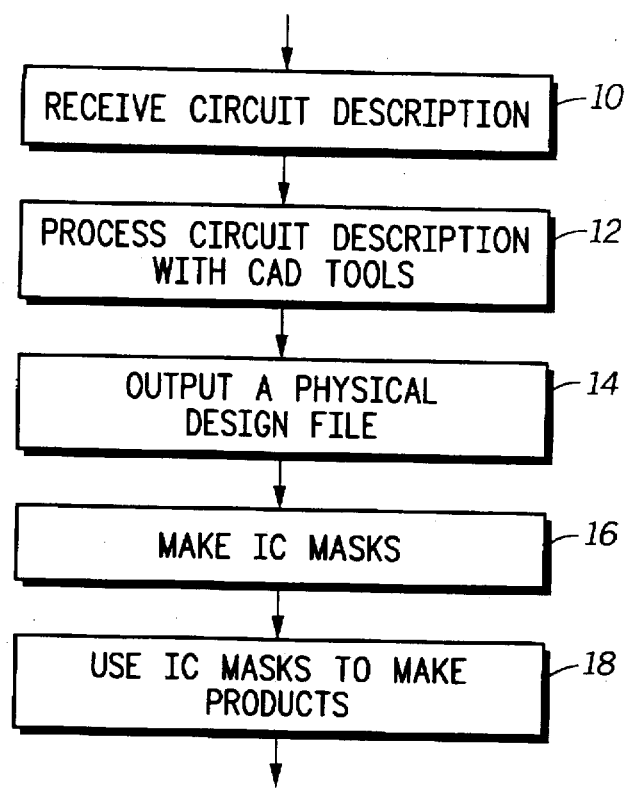
FIG. 1 illustrates, in a flowchart, a method for making an integrated circuits in accordance with the present invention.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Generally, the present invention is a method and apparatus for designing circuits. The circuits that are typically designed using the techniques taught herein are integrated circuits (ICs) although other circuits/systems may be manufactured. First, a computer running computer aided design (CAD) software is used to design a circuit. A programmer or circuit designer enters into a computer a behavior circuit model or data file which contains many computer instructions and/or assignment statements which collectively describe the mathematical operation of a circuit. For example, the file may include an AND instruction (A=B&C) which is intended to define a two-input AND gate where the AND gate has two inputs B and C and one output A. An instruction for a four-input NOR gate may be entered as A'=B+C+D+E where the four inputs are A, B, C, and D, the output is A', and "'" means an inversion operation. More complex instructions such as A=(C+D)&B&E+(F&G) are also possible.

This behavioral circuit model is read and parsed by the CAD techniques further taught below. In general, the CAD tool reads and parses the above instructions and generates an output file which represents the equations from the behavioral circuit model via a plurality of logic gates. In other words, the textual operation of the equations in the behavior circuit model are mapped into a logic gate level description having an analogous operation. The logic gates are read from a library stored in memory wherein the stored each logic gate has a unique combination of: (1) logic function (D-flip-flop, AND, NAND, NOR, OR, XOR, XNOR, latch, tri-state buffer, etc.); 2) power rail/conductor sizing; (3) geometric pitch (i.e., height); and (4) current drive or drive strength, to give design flexibility and efficiency. In prior methods these four elements were not used in automated design and therefore one or more of speed, circuit area, design time, etc., suffered. Once the logic gates are properly selected by the CAD tools (see below) a two-dimensional layout file is generated to indicate specific physical placement of transistors in order to get an IC layout which has the operation of the behavior circuit model. Integrated circuit masks are then made to manufacture wafers or ICs having the operation initially identified by the behavioral circuit model. The above method, by using library-defined logic gates along with some custom layout, is referred to herein as a new semi-custom design methodology.

The methods taught herein solve many problems and improve CAD designing over prior methods. The prior art semi-custom design methodology has successfully reduced design cycle time. However, prior methods tend to produce circuits with significantly lower density and reduced performance than full custom techniques. For this reason, full custom design (using no library-gates or a minimum number of library-gates) has remained common despite its large design time requirement. The methodology taught herein is a new methodology for physical IC design that improves the density, performance, and power consumption of semi-custom standard cell based IC designs. The methodology taught herein uses new physical design tools, new databases, and a new organization of these tools.

Automatic gate sizing is one technique which is used via the methods herein to ensure improved density while not sacrificing performance. Automatic gate sizing is an algorithm that adjusts drive strengths of transistors within gates in an efficient manner such that speed performance specifications are adhered to for the IC while circuit density is maximized. The automatic gate sizing methodology not only improves the density and performance of existing semi-custom designs, but extends automated design methodology to many designs that currently require full custom methodologies thereby reducing design cycle time.

The key to the automatic gate-sizing design methodology is a global gate optimization tool. This tool provides the ability to optimize the implementation of a design after logic synthesis has produced the logic gate circuit implementation. The global gate optimization tool uses a very large gate library that is produced using an automatic gate layout synthesis tool. The process taught herein allows for a number of optimizations, such as optimal driver size selection, library pitch determination, and power-rail size determination (these are further discussed below).

The present invention can be further understood with reference to FIGS. 1–6. FIG. 1 illustrates a flowchart which illustrates how to design one or more integrated circuits or semiconductor wafers. Steps 10–14 are used to design the circuit via a computer. In step 10, a behavior circuit model (BCM) is generated or received by a computer. In step 12, the BCM is processed in order to reduce the BCM from instructions and/or assignment statements to a logic gate netlist or a logic gate file. The logic gate file is then converted from gates to a two-dimensional transistor layout of the IC via a step 14. Once the physical layout of the transistors and gates are identified via the step 14, a step 16 may be used to make IC photolithography masks from the files/data output via step 14. An IC manufacturing facility is then used to manufacture one or more ICs using the masks from step 16. This design and manufacturing phase may take several iterations in order to produce a working product and once steps 10–16 have been perfected for a part, ICs are made in step 18 continuously until new circuit modifications are required or manufacture is halted.

Figure 2:
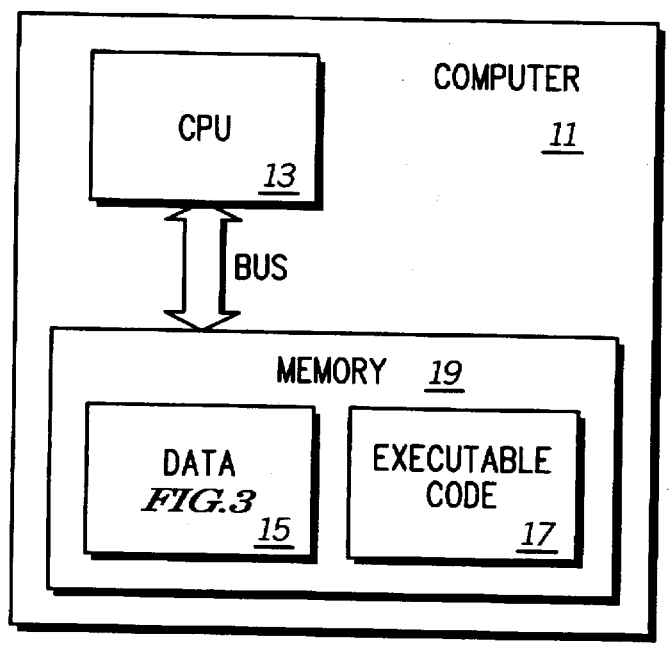
FIG. 2 illustrates, in a block diagram, a data processing system which allows an engineer to design an integrated circuit layout for use in making masks and integrated circuit product in accordance with the present invention.

FIG. 2 illustrates a computer system which is used to perform the design steps 10–14 of FIG. 1. FIG. 2 illustrates a computer 11 having a CPU 13 and a memory 19. The CPU is any circuitry which executes computer instructions or manipulates computer data. The memory is any memory device or device(s) which are used to store computer data. Memory 199 may include one or more of tape storage, disk storage, CD storage, SRAM, DRAM, EEPROM, EPROM, ROM, flash storage, or like computer memory devices.

Within the memory, 19 is a data area 15 which stores computer data and executable code 17. The CPU 13 reads and decodes computer instructions from code 17 and uses the results of the decoding to process the numerical values stored via the data area 15. In general, FIG. 2 illustrates the hardware environment in which all the computer aided design (CAD) of steps 10–14 occurs.

Figure 3:
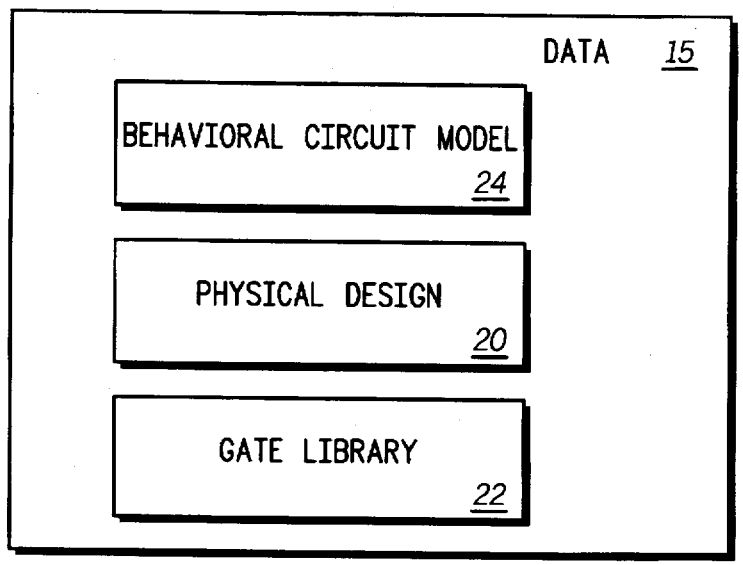
FIG. 3 illustrates, in a block diagram, various data files which reside within the data section of FIG. 2.

FIG. 3 illustrates the files stored in data area 15 of FIG. 2. In order to understand the file structure a brief description of the process of designing an IC file from a behavioral circuit model (BCM) file should be discussed. A BCM file 24 is input and contains a plurality of assignment or computer instructions which define the logical operation of the circuit. The BCM data file 24 is changed to a logic gate file by changing the equations in the BCM file to a gate interconnection file by using predetermined gates read from a gate library 22. Once the logic gate file is formed, the logic gate file is changed from a plurality of instructions indicating gates and their interconnections to a physical design file 20 which indicates a two-dimensional layout of the gates in the logic gate file.

FIG. 3 illustrates a register transfer level (RTL) or BCM data file 24. Data file 24 contains the behavioral circuit model (BCM) of the circuit design. This circuit model specifies the intended behavior or operation of the circuit design. Usually, a BCM will be a character file, text file, ASCII file, or a like file which has the appearance of a computer language (i.e., is a series of computer instructions similar to C, BASIC, etc. and described the logical operation of a circuit). File 24 is an input file to the processing steps taught herein. Data file 20 contains the physical design description which is the output file of the process taught herein. The BCM data file 24 is read as input and processed via the steps of FIG. 4 to arrive at the data file or physical design file 20, which is a two-dimensional layout of a circuit described by the BCM file 24. The file 20 is the same two-dimensional file or file(s) used to make masks or mask layers which are needed to fabricate the integrated circuit in an IC fabrication facility by depositing conductors and insulators, etchings, implanting, thermally processing, and performing other like and known operations.

In FIG. 3, Date file 22 contains the gate or logic device library which is used to transform the BCM file 24 to the file 20 by changing assignment statements in the file 24 to logic gate representations and then to two-dimensional logic gate devices interconnected to perform the operations defined by the file 24. The gate library contains a plurality of logic gate two-dimensional layouts which are selected based upon the instructions/statements of file 24. The gate library consists of library cells that vary in their logic function, their drive strength (current driving ability), their cell height or pitch, and their power rail size (power supply ability). For each cell in the library, the physical design of the cell, the circuit design of the cells, as well as the behavioral model of the cell are present.

Figure 4:
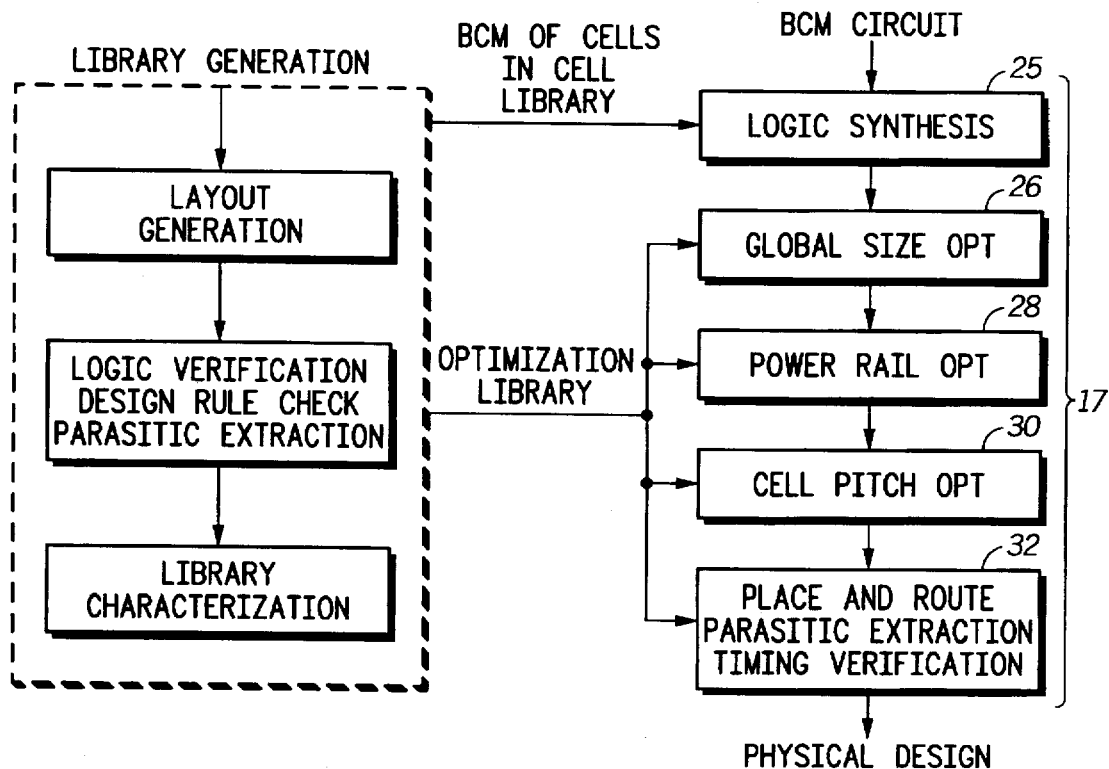
FIG. 4 illustrates, in a flowchart, a method for designing an integrated circuit physical design file from a BCM input file in accordance with the present invention.

FIG. 4 illustrates the process of generating a physical circuit file from a behavioral circuit model (BCM). Step 25 reads the BCM file which describes the operation of the circuit design, and also reads the behavioral circuit description of each cell in the library as needed to map assignment statements in the BCM to corresponding logic gates. An example of a BCM file describing a circuit operation is shown in Code Segment 1 below:

```
Code Segment 1:
    module      NineCell (a, b, c, d, e, f g, x, y, z);
    input       a;
    input       b;
    input       c.
    input       d;
    input       e;
    input       f;
    input       g;
    output      x;
    output      y;
    output      z;
    wire        x;
    wire        y;
    wire        z;
    assign
    x = c & d & e & f & g l a & c & e,
    y = a & b & c & e l a & b & c & e & f & g,
    z = a & c & d & e & f & g l b & f;
    endmodule
```

Therefore, the code from code segment one above is an example of the input to the step 25 of FIG. 4. Step 25 takes the BCM code above and converts the code to a set of interconnected logic cells. These logic cells can be of any function such as AND, OR, inverter, NOR, NAND, XOR, transfer gate, or a like logic gate. For example, the Code Segment 1 is parsed, pattern matched, compared, and processed to output a file or change the BCM file to a file which resembles the following:

---

Code Segment 2:
    module NineCell (a, b, c, d, e, f g, x, y, z);
    input a, b, c, d, e, f g;
    output x, y, z;
        wire n63, n64, n65, n66, n67, n68;
        nand3 U7 {.in__0(d), .in__1(g), in__2(f), .out(n64)};
        nand2 U8 {.in__0(c), .in__1(e), .out(n65)};
        nand2 U9 {.in__0(f), .in__1(b), .out(n67)};
        nand2 U10 {.in__0(a), .in__1(b), .out(n68)};
        nor2 U11 {.in__0(n65), .in__1(n68), .out(y)};
        inv U12 {.in__0(a), .out(n63)};
        or3 U4 {.in__0(n65), .in__1(n63), .in__2(n64), .out(n66)};
        nand2 U5 {.in__0(n66), .in__1(n67), .out(a)};
        aoil2 U6 {.in__00(n65), .in__10(n63), .in__11(n64), out(x)};
endmodule

---

Figure 5:
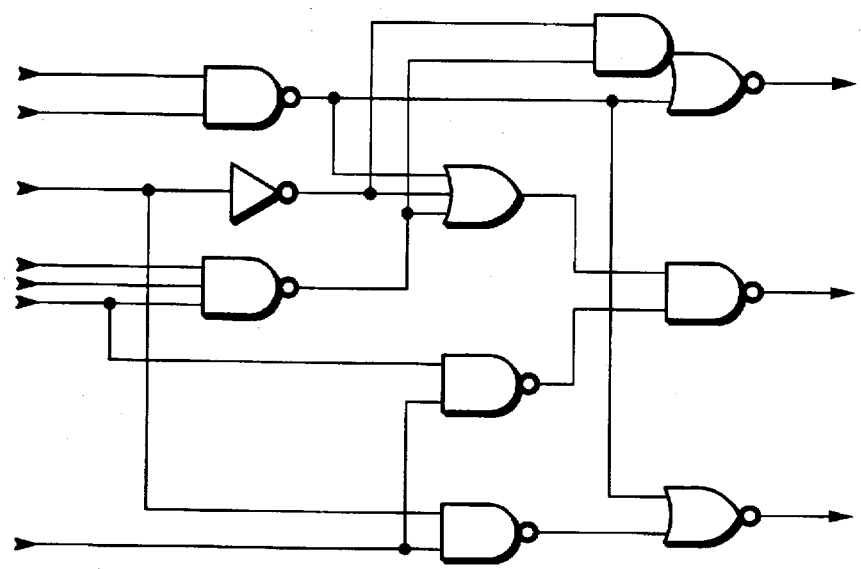
FIG. 5 illustrates, in a schematic diagram, a circuit which is derived from a behavior model and used to generate a two-dimensional layout which is used to make integrated circuits in accordance with the present invention.

This code segment 2 is one possible output from step 25 for the input from code segment 1. The output of the step 25 is sometimes referred to as a structural circuit description (SCD). After step 25, each cell in the SCD is specified in terms of its logic function only and no strengths, pitch, power rail sizing, etc. is identified. The circuit described by code segment 2 is illustrated in FIG. 5.

Step 26 considers the possible drive strengths of each cell in the SCD and determines which drive strength needs to be used for each cell, such that the user specified timing is met. In general Step 26 typically consists of one of the two following methods:

Method 1: Analyze the circuit to determine the timing of the paths in the circuit. From the timing information, determine if the circuit meets the user specified constraints. If not, choose one or more elements in the circuit and change it's/their size based on some predetermined criteria; and repeat the procedure.

Method 2: Analyze the circuit and from it, construct a set of mathematical equations that represent the delay of the total circuit in terms of the delay of the elements as a function of the element drive strengths. Using one of many well known mathematical methods, such as simplex or linear program solving, solve the system of equations by determining the drive strength of each element.

After step 26, each cell in the SCD is specified in terms of its logic function and its drive strength to provide proper input to output propagation times which are within predetermined specified time constraints given to the designers. The input to step 26 is the SCD and the output is a file which resembles:

---

Code Segment 3:
    module NineCell (a, b, c, d, e, f, g, x, y, z);
    input a, b, c, d, e, f g;
    output x, y, z;
        wire n63, n64, n65, n66, n67, n68;
        nand3__S1 U7 {.in__0(d), .in__1(g), .in__2(f), .out(n64)};
        nand2__S2 U8 {.in__0(c), .in__1(e), .out(n65)};
        nand2__S5 U9 {.in__0(f), .in__1(b), .out(n67)};
        nand2__S2 U10 {.in__0(a), .in__1(b), .out(n68)};
        nor2__S3 U11 {.in__0(n65), .in__1(n68), .out(y)};
        inv__S1 U12 {.in__0(a), .out(n63)};
        or3__S1 U4 {.in__0(n65), .in__1(n63), .in__2(n64), .out(n66)};
        nand2__S4 U5 {.in__0(n66), .in__1(n67), .out(z)};
        aoil2__S2 U6 {.in__00(n65), .in__10(63), .in__11(n64), .out(x)};
endmodule

---

The __S# text in the code segment 3 where # is a number of 1 to N where N is an integer upper limit of maximal size is an indication of the drive strength or size of the respective gate. For example, "nand3__S1" is a NAND gate with three inputs where the size is S1 (or a small size in the library of "nand3" gates stored via file 22 in FIG. 3. Also, "nor2__s3" is a NOR gate with two inputs and a larger strength or size of three. The numbering of the strengths is arbitrary in that a small number may mean a large drive strength or vice versa. In all cases though, for example, a nand3__S1 will not be equal in drive strength to a nand3__S2.

In step 28, the power needed in the entire circuit or a significant circuit portion of the circuit is considered. The power needed determines the size (photolithographic width or cross sectional area) of the power rail which is needed to effectively handle this level of power. A plurality of power rail sizes are specifically available for each type of gate in the file 22 of FIG. 3 and a proper power rail size for the determined power is set for each logic gate in the file output from step 26 and input to step 28. The power rail size of each cell is chosen such that sufficient current can be conducted through the power rail of the cells. After step 28, each cell is specified in terms of its logic function (step 25), its drive size (step 26), and its power rail size (step 28). Circuit Segment 4 below shows an example of a structural circuit description after processing via the step 26.

---

Code Segment 4:
    module NineCell (a, b, c, d, e, f g, x, y, z);
    input a, b, c, d, e, f g;
    output x, y, z;
        wire n63, n64, n65, n66, n67, n68;
        nand3__S1__P2 U7 {.in__0(d), .in__1(g), .in__2(f), .out(n64)},
        nand2__S2__P2 U8 {.in__0(c), .in__1(e), .out(n65)};
        nand2__S5__P2 U9 {.in__0(f), .in__1(b), .out(n67)}
        nand2__S2__P2 U10 {.in__0(n65), .in__1(n68), .out(n68)}
        nor2__S3__P2 U11 (.in__0(n65), .in__1(168), .out(y)};
        inv__S1__P2 U12 {.in__0(a), .out(n63)};
        or3__S1__P2 U4 {.in__0(n65), .in__1(n63), .in__2(n64), .out(n66)}
        nand2__S4__P2 U5 {.in__0(n66), .in__1(n67), .out(z)};
        aoil2__S2__P2 U6 {.in__00(n65), .in__10(n63),
            .in__11(n64),
    .out(x)};
endmodule

---

Step 30 considers the aspect ratio variation available for each cell in the SCD. Each logic gate layout can be made more square or more rectangular in shape in order to properly fit in integrated circuit space which is available. A circuit or logic gate may be made with a large height and a small width, vice versa, or with nearly equal heights and widths. From these aspect ratios, the aspect ratio that minimizes the total area of the circuit or best fits onto the IC layout with other circuits or circuit modules is chosen for each cell in the SCD. After step 30, each cell in the SCD is specified in terms its logic function, its driver size, its power raft size and its aspect ratio (step 30). The size of a gate is usually referred to as it's pitch or height. Code Segment 5 illustrates a code segment after processing via step 30 with the input being code segment 4.

---

Code Segment 5:
    module NineCell (a, b, c, d, e, f g, x, y, z);
    input a, b, c, d, e, f g;
    output x, y, z;
        wire n63, n64, n65, n66, n67, n68;
        nand3__S1__P2__H186 U7 {.in__0(d), .in__1(g), .in__2(f),
    .out(n64)};
        nand2__S2__P2__H186 U8 {.in__0(c), .in__1(e), .out(n65)};

```
            nand2_S5_P2_H186 U9 {.in_0(f), .in_1(b), .out(n67)};
            nand2_S2_P2_H186 U10 {.in_0(a), .in_1(b),
            .out(n68)};
            nor2_S3_P2_H186 U11 (.in_0(n65), .in_1(n68),
            .out(y)};
            inv_S1_P2_H186 U12 {.in_0(a), .out(n63)};
            or3_S1_P2_H186 U4 {.in_0(n65), .in_1(n63),
            .in_2(n64),
        .out(n66)};
            nand2_S4_P2_H186 U5 {.in_0(n66), .in_1(n67),
            .out(x)};
            aoi112_S2_P2_H186 U6 {.in_00(n65), .in_10(n63),
        .in_11(n64), .out(x)};
        endmodule
```

In step 32, the physical layout description of each cell in the SCD is transformed into the physical layout description for the entire circuit. The physical layout description is data base which stored information which may be used to generate IC masks. Usually, the physical design is a data base which indicates several structure layers which are stacked on top of one another. These layers may include source/drain regions, channel implant regions, isolation areas, field implant regions, gate electrodes, polysilicon interconnects, metal layers, vias and contact holes, and the like. The data is usually stored in a format which identifies the mask level by number and then gives series of polygons, rectangles or squares in a two-dimensional X/Y coordinate scheme to describe the physical layout of the circuit generated via step 25 from a BCM input. For example, a polysilicon gate layer may be layer 5 and have a rectangle region identified by 1,1; 1,3; 3,5; 1,5 where each of these four pairs of numbers described in an X/Y coordinate fashion the corners of the gate electrode. Many gate electrodes (many millions) will exist in level 5 for modern microprocessor circuits and a description, for example, will appear as:

| layer 5: | |
|---|---|
| 1,1; 1,3; 3,5; 1,5 | {a rectangular electrode} |
| 5,5; 5,9; 6,9; 6,7; 9,7; 9,5 | {an L shaped electrode} |
| 20,10; 20,20; 30,20; 30,10 | {a square gate electrode} |
| etc. | |

Figure 6:
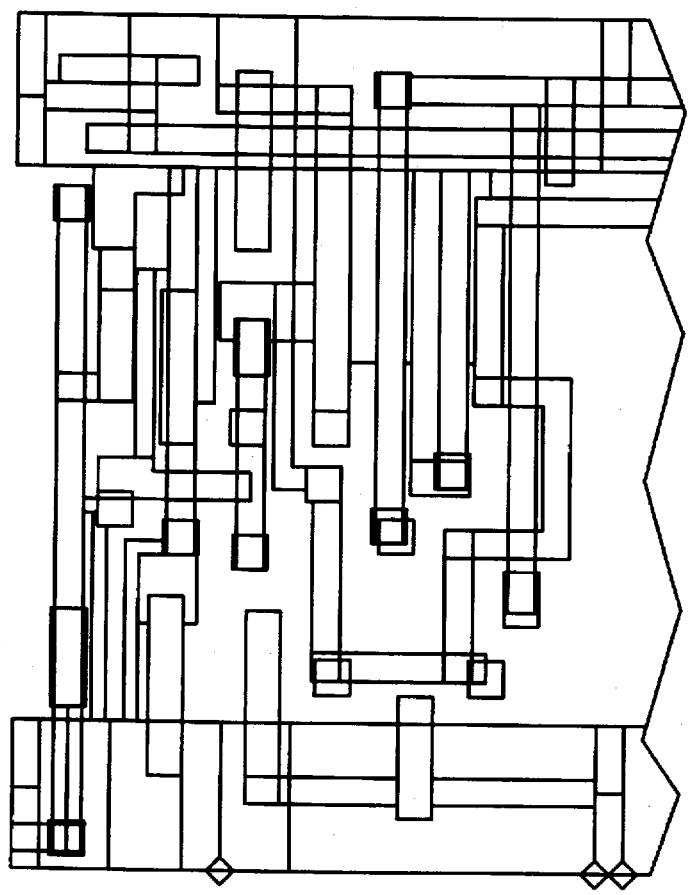
FIG. 6 illustrates, in a top-down perspective, a two-dimensional physical design file (layout) of the circuit of FIG. 5.

When the physical design file output from FIG. 4 is illustrated graphically for all layer, a portion of the circuit of FIG. 5 will look as in FIG. 6. In other words, FIG. 6 illustrates a portion of the circuit of FIG. 5 as it will appear on a plurality of IC masks and on a substrate on an integrated circuit.

The gates which are defined, one physical characteristic at a time in FIG. 4, are stored in a two dimensional database format in the gate library 22 in FIG. 3. These predetermined gate layouts are accessed in step 32 in response to the instructions input to step 32 (the SCD of code segment 5 is the input). Each line of code in code segment 5 which is input to step 32 of FIG. 4 identifies one gate in the library 22 for use in assembling the physical design file.

In file 22 of FIG. 3, many gates which have different logic functions are stored. The logic functions will include one or more of NAND, NOR, inverter, transfer, XOR, AND, OR, buffer, latches, MUX, flip-flops, counters, and like gates. And for each of these functions, there may be different gates having different numbers of inputs (i.e., two, three, four, etc. input gates). For each of these gates types, several gate devices with the same logic type will have associated with them different drive strengths. For example, there is only one two-input NAND gate type but there may be six stored two-input NAND gates wherein each of these gates have different drive strengths. Drive strengths are varied by changing the width/length ration of the transistors used to form the gates so that speed and current flow of the device is altered.

For each of these six different gate strengths, each two-input NAND gate with a different strength (6 cells) may each have different power rail sizing. Power rail sizing are the actual physical size of the Vdd and ground power lines. Their size determines the amount of power or current which can be maximally consumed by a circuit without design/structural damage occurring. If 6 different rail sizing are used, then each of the 6 gates have six different rail sizing resulting in 36 totals gates each having a different combination of rail sizing and drive strengths but all being two-input NAND gates.

Each unique two-input NAND gate will have a different physical shape or height/pitch. Therefore for each of the 36 gates above, the designer may chose to have four different heights to allow for optimized physical layout. Therefore, the 36 gates become 144 two-input NAND gates each having a unique combination of drive strength, rail sizing, and pitch and all being stored in file 22 of FIG. 3 for use in the method of FIG. 4. Table 1 below shows a series of stored three-input OR gates wherein each OR gate has a unique combination of drive strength, rail sizing, and pitch. In this table, there are two possible drive strengths, two possible pitches, and three possible rail sizing (where 2×2×3=12 total gates):

TABLE 1

| type | drive strength | pitch | rail sizing |
|---|---|---|---|
| OR3 | 1 | 1 | 1 |
| OR3 | 2 | 1 | 1 |
| OR3 | 1 | 2 | 1 |
| OR3 | 2 | 2 | 1 |
| OR3 | 1 | 1 | 2 |
| OR3 | 2 | 1 | 2 |
| OR3 | 1 | 2 | 2 |
| OR3 | 2 | 2 | 2 |
| OR3 | 1 | 1 | 3 |
| OR3 | 2 | 1 | 3 |
| OR3 | 1 | 2 | 3 |
| OR3 | 2 | 2 | 3 |

Any one of these gates may be used for design via FIG. 4 and each of these gates is stored in an X/Y layout format in the file 22 of FIG. 3 for easy access, layout, and routing.

While the present invention has been illustrated and described with reference to specific embodiments, further modifications and improvements will occur to those skilled in the art. For example, a plurality as used herein is intended to mean any value within the range of 2 to ∞ and should not be limited to any sub-range or constant other than this broad range. It is to be understood, therefore, that this invention is not limited to the particular forms illustrated and that it is intended in the appended claims to cover all modifications that do not depart from the spirit and scope of this invention.

What is claimed is:

1. A method for designing a circuit, the method comprising the steps of:

receiving a behavioral circuit model from memory, the behavior circuit model having a plurality of logic functions which collectively define the circuit, the circuit being adapted of perform logic operations within a microprocessor integrated circuit;

receiving circuit device library data from the memory which contains predetermined library-defined logic gates wherein each predetermined library-defined logic gate in the predetermined library-defined logic gates is unique from all other predetermined library-defined logic gates in the predetermined library-defined logic gates;

processing the behavioral circuit model and the circuit device library data to generate a structural circuit model which contains an interconnection of predetermined library-defined logic gates in accordance with the plurality of logic functions;

further processing the structural circuit model wherein each predetermined library-defined logic gate in the structural circuit model is set to a particular drive strength;

further processing the structural circuit model to determine a size of power rails for each predetermined library-defined logic gate in the structural circuit model;

further processing the structural circuit model to determine a physical two-dimensional layout of each predetermined library-defined logic gate in the structural circuit model; and placing and routing each predetermined library-defined logic gate used in the structural circuit model into an integrated circuit layout form to create a physical design file of said circuit from the structural circuit model.

2. The method of claim 1 wherein the step of receiving circuit device library data comprises:

receiving circuit device library data wherein the circuit device library data contains data for all of flip-flops, NAND gates, NOR gates, XOR gates, and tri-state buffers.

3. The method of claim 2 wherein the step of receiving circuit device library data comprises:

receiving circuit device library data wherein each predetermined library-defined logic gate has a unique combination of: (1) logic function; (2) drive strength; (3) power rail sizing; and (4) geometric pitch.

4. The method of claim 1 wherein the step of further processing the structural circuit model wherein each logic gate in the structural circuit model is set to a particular strength comprises:

further processing the structural circuit model wherein each predetermined library-defined logic gate in the structural circuit model is set to a particular drive strength wherein the predetermined drive strength of each logic gate is set by determining aspect ratios of gate electrodes of transistors used to form each logic gate.

5. The method of claim 4 wherein the step of further processing the structural circuit model wherein each predetermined library-defined logic gate in the structural circuit model is set to a particular strength comprises:

setting the aspect ratios of the of gate electrodes of transistors used to form each predetermined library-defined logic gate wherein the aspect ratios include a length and a width of the gate electrodes.

6. The method of claim 1 wherein the step of further processing the structural circuit model to determine a size of power rails for each predetermined library-defined logic gate in the structural circuit model comprises:

defining a width of a ground conductor coupled to each library-defined logic gate to supply a ground voltage and defining a width of a power supply conductor coupled to each predetermined library-defined logic gate to supply a power voltage.

7. The method of claim 1 further comprising the step of:

making lithographic masks from the physical design file wherein the lithographic masks are used to form integrated circuits in accordance with the physical design file.

8. The method of claim 1 further comprising the step of:

manufacturing a plurality of integrated circuits in accordance with the integrated circuit layout of the physical design file.

9. A method for designing a microprocessor integrated circuit having a particular operation, the method comprising the steps of:

receiving a behavioral circuit model defining, in several lines of code, the particular operation of the microprocessor integrated circuit;

forming a physical design file using the behavioral circuit model wherein the physical design file is formed by generating a two-dimensional integrated circuit layout from lines of code of the behavioral circuit model, wherein the two-dimensional integrated circuit layout contains selected electrical devices selected from a library in memory where the library stores a plurality of electrical devices, the selected electrical devices being connected in accordance with the behavioral circuit model, each electrical device in the library having a unique combination of: (1) logic function; (2) drive strength; (3) power rail sizing; and (4) physical pitch when compared to all other electrical devices in the library; and automatically replacing selected logic devices in the two-dimensional integrated circuit layout to other electrical devices selected from the library in a time iterative manner so that some optimization of all of physical pitch, drive strength, and power rail sizing is achieved for at least one electrical device within the two-dimensional integrated circuit layout.

10. The method of claim 9 wherein the step of forming a physical design file from the behavioral circuit model comprises:

setting the aspect ratios of gate electrodes of transistors used to form each electrical device to predetermined value which allows a certain level of current flow through each transistor.

11. The method of claim 10 wherein step of setting the aspect ratios comprises:

setting a width and length of each gate electrode to a predetermined width/length ratio.

12. The method of claim 9 wherein the step of forming a physical design file from the behavioral circuit model comprises:

defining a width of a ground conductor coupled to each electrical device, the ground conductor being used to supply a ground potential to the integrated circuit; and defining a width of a power supply conductor, the power supply conductor being coupled to each electrical device to supply a power potential to the integrated circuit.

13. The method of claim 9 wherein the step of forming a physical design file from the behavioral circuit model comprises:

setting the geometric layout of the electrical devices by defining an overall width and an overall height of each electrical device in the library.

14. A method for forming a plurality of microprocessor integrated circuits comprising the steps of:

receiving a behavioral circuit model defining, in several lines of code, a plurality of logic functions which are inter-coupled to perform a microprocessor operation;

processing the behavioral circuit model to generate a data file containing a plurality of predetermined library-defined logic gates interconnected to perform the operation described via the behavioral circuit model, wherein each predetermined library-defined logic gate in the plurality of predetermined library-defined logic gates used within the data file is unique from all other predetermined library-defined logic gates in the predetermined library-defined logic gates;

further processing the behavioral circuit model wherein each predetermined library-defined logic gate in the data file is set to a particular strength;

further processing the data file to determine a size of power rails for each predetermined library-defined logic gate in the data file;

further processing the data file to determine a physical two-dimensional layout of each predetermined library-defined logic gate in the data file;

placing and routing each predetermined library-defined logic gate in the data file in an integrated circuit layout to form a physical design file used to physically define the plurality of integrated circuits; and using layout data, provided via the physical design file, to manufacture the plurality of integrated circuits wherein each integrated circuit in the plurality of circuits has a operation substantially similar to the operation of the behavioral circuit model.

15. The method of claim 14 wherein the step of using layout data, provided via the physical design file, to manufacture the plurality of integrated circuits comprises:

procuring lithographic masks in accordance with the physical design file; and using the lithographic masks to manufacture the plurality of integrated circuits.

16. The method of claim 14 wherein the step of further processing the behavioral circuit model wherein each logic gate in the behavioral circuit model is set to a particular strength comprises:

setting the particular strength of each logic gate by setting physical parameters of the logic gate such that each logic gate has a predetermined capability selected from a group consisting of: a predetermined switching speed, a predetermined maximal current, and a predetermined maximal fan-out.

17. The method of claim 14 wherein the step of further processing the behavioral circuit model wherein each logic gate in the behavioral circuit model is set to a particular strength comprises:

setting aspect ratios of the gate electrodes of transistors used to form each logic gate wherein aspect ratio= width/length of the gate electrodes of the transistors.

18. The method of claim 14 wherein the step of further processing the behavioral circuit model wherein each logic gate in the behavioral circuit model is set to a particular strength comprises:

defining a width of a ground conductor coupled to each logic gate to supply a ground voltage and defining a width of a power supply conductor coupled to each logic gate to supply a power voltage.

19. A microprocessor circuit design tool stored on storage media, the circuit design tool comprising:

a plurality of binary values for receiving a circuit input file defining, in several lines of code, a plurality of logic gates which are inter-coupled;

a plurality of binary values for processing the circuit input file to assign one predetermined library-defined logic gate to each logic gate described within the circuit input file, each predetermined library-defined logic gate which is assigned being unique in cell pitch, drive strength, logic function, and power rail sizing combination from all other predetermined library-defined logic gates;

a plurality of binary values for further processing the circuit input file wherein each logic gate in the circuit input file is set to a particular strength;

a plurality of binary values for further processing the circuit input file to determine a size of power rails for each logic gate in the circuit input file;

a plurality of binary values for further processing the circuit input file to determine a physical two-dimensional layout of each logic gate in the circuit input file;

a plurality of binary values for placing and routing each logic gate in the circuit input file in an integrated circuit layout to form a physical design file of an integrated circuit; and a plurality of binary values for using placement data, provided via the physical design file, to result in manufacture of the integrated circuit.

20. A microprocessor circuit design tool stored on storage media, the circuit design tool comprising:

a first plurality of binary values for receiving a circuit input file defining, in several lines of code, a plurality of microprocessor electrical devices which are inter-coupled;

a second plurality of binary values, serially accessed after the first plurality of binary values, for forming a physical design file from the circuit input file wherein the physical design file is formed by mapping the plurality of electrical devices represented via the several lines of code to two-dimensional layout electrical devices wherein the two-dimensional layout electrical devices are selected from a library in memory, the library storing a plurality of two-dimensional layout electrical devices wherein each electrical device in the plurality of electrical devices is mapped to one two-dimensional layout electrical device in the library, each two-dimensional layout electrical device in the library having a unique (1) logic function; (2) device strength; (3) power raft sizing; and (4) geometric layout when compared to all other two dimensional layout electrical devices in the library; and a third plurality of binary values, serially accessed after the second plurality of binary values, for automatically replacing the two-dimensional electrical devices in the physical design file to other electrical devices selected from the library, the replacement being performed in a time iterative manner so that some optimization of all of physical pitch, drive strength, and power rail sizing is achieved for at least one electrical device within the physical design file.

21. A circuit design tool stored on storage media, the circuit design tool comprising:

means for receiving a circuit input file defining, in several lines of code, a plurality of logic gates which are inter-coupled;

means for processing the circuit input file to assign one predetermined library-defined logic gate to each logic gate described within the circuit input file, each predetermined library-defined logic gate which is assigned being unique in cell pitch, drive strength, logic function, and power rail sizing combination from all other predetermined library-defined logic gates;

means for further processing the circuit input file wherein each logic gate in the circuit input file is set to a particular strength;

means for further processing the circuit input file to determine a size of power rails for each logic gate in the circuit input file;

means for further processing the circuit input file to determine a physical two-dimensional layout of each logic gate in the circuit input file;

means for placing and routing each logic gate in the circuit input file in an integrated circuit layout to form a physical design file of an integrated circuit; and means for using placement data, provided via the physical design file, to result in manufacture of the integrated circuit.

\* \* \* \* \*